United States Patent [19]

Matsuoka

[11] Patent Number: 5,169,321
[45] Date of Patent: Dec. 8, 1992

[54] ELECTROPLATED CONTACT WITH INSULATING MATERIAL

[75] Inventor: Noriyuki Matsuoka, Yokohama, Japan

[73] Assignee: Yamaichi Electric Co., Ltd., Tokyo, Japan

[21] Appl. No.: 734,690

[22] Filed: Jul. 23, 1991

[30] Foreign Application Priority Data

Jul. 24, 1990 [JP] Japan .................. 2-197016

[51] Int. Cl.⁵ .................................. H01R 9/09
[52] U.S. Cl. ........................ 439/71; 439/886
[58] Field of Search ............ 439/70, 71, 66, 83, 439/418, 881, 886, 630

[56] References Cited

U.S. PATENT DOCUMENTS

| | | | |
|---|---|---|---|
| 2,816,275 | 12/1957 | Hammel | 439/886 X |
| 3,927,841 | 12/1975 | Iacobucci | 439/886 |
| 4,577,922 | 3/1986 | Stipanuk et al. | 439/83 X |
| 4,662,702 | 5/1987 | Furuya | 439/630 |
| 4,780,093 | 10/1988 | Walse et al. | 439/418 |
| 4,921,430 | 5/1990 | Matsuoka | 439/886 X |
| 4,998,886 | 3/1991 | Werner | 439/66 |

OTHER PUBLICATIONS

IBM Technical Disclosure Bulletin, vol. 32, No. 7, Dec. 1989.

*Primary Examiner*—Neil Abrams
*Assistant Examiner*—Khiem Nguyen
*Attorney, Agent, or Firm*—Wenderoth, Lind & Ponack

[57] ABSTRACT

A contact has a contacting portion adapted to contact with an electric part. A spring portion has elasticity for exerting a contacting force on the contacting portion, and a terminal portion is attached to a circuit board, by soldering, and adapted to provide electric conductivity. After insulating material is attached to a side surface between the contacting portion and the terminal portion, a favorable electrically conductive material is electrically plated on the remaining portion. An electric conduction path is formed in an area starting at the contacting portion and ending at the terminal portion with the favorable conductive material.

4 Claims, 4 Drawing Sheets

ELECTROPLATED CONTACT WITH INSULATING MATERIAL

BACKGROUND OF THE INVENTION

1. Field of the Invention

This invention relates to a contact used for contacting an external terminal of an electric part, such as an IC package, etc.

2. Brief statement of the Prior Art

In a socket for an IC, etc., there is often a contact used having at one end thereof a terminal portion to be contacted with a circuit board, and at the other end a spring portion bent into a generally horizontal U-shape, the spring portion being provided at a free end thereof with a contacting portion on which an external terminal is to be placed for contact. The contact is plated with Au on a bed of Ni which is plated on the entire surface of the contact, a vertical elasticity being given to the contact.

The plating of Au on the bed of Ni which is plated on the entire surface of the contact is employed for the purposes of increasing the electric conductive efficiency of the contact and prohibiting the generation of oxide film on the contacting portion of the contact on which an external terminal of an IC is to be placed for contact and also on the surface of a terminal to be connected with a circuit board, etc. However, the problem that gold is very expensive is well known. Therefore, as a means for satisfying the above conditions, and saving gold for achieving a low cost, contacts have been heretofore punched out in a multiple connected state instead of being punched out individually. Ni is first plated on the entire surface of the contact in the plating process, and then Au is plated on only the contacting portion and the terminal portion with a mask applied to the remaining portion. Thereafter the contact assembly, being in the multiple connected state, is separated into individual contacts as final products.

However, although it is possible for the above-mentioned conventional method to save on the consumption of gold by plating Au only on the connecting portion and terminal portion, it has problems in that the plating process becomes very complicated. As a result, the operational expenses are increased, making it difficult to produce a low-priced contact as a component part.

Further, although it is possible for the conventional method to save on the consumption of gold, it gives rise to another problem in that an electric conductive path is formed of Ni, which has a lower electric conductivity than Au, between the contacting portion and the terminal portion. This is undesirable.

The present invention has been accomplished in order to solve the above problems inherent in the prior art.

SUMMARY OF THE INVENTION

It is therefore an object of the present invention to provide a contact which has a favorable electric conductive path between a contacting portion and a terminal portion and yet requires a lower consumption of gold for plating.

To achieve the above object, the present invention is designed such that, after an insulating material is intimately attached to at least one side between a contacting portion and a terminal portion of a contact, a favorable conductive matter such as Au, etc. is electrically plated on the remaining part of the contact to form a favorable conductive path between the contacting portion and the terminal portion. At the same time, the insulating material is utilized as a means for insulating every adjacent contact.

Since the contact according to the present invention is constructed in the manner as mentioned above, an electric conductive path can be formed between the contacting portion and the terminal portion using the favorable conductive material. At the same time, the plating process can be simplified and a saving on the consumption of gold can also be achieved, thus realizing a low-priced contact. In addition, the insulating material can be utilized as a means for insulating every adjacent contact.

The above and other objects, characteristic features and advantages of the present invention will become more apparent upon a reading of the following detailed description of the embodiment with reference to the attached drawings.

BRIEF DESCRIPTION OF THE DRAWINGS

FIG. 7A is a side view of a strip material as the punching-out material, FIG. 7B being a side view of the strip material showing a punched-out state, and FIG. 7C being a side view of a contact which has already been punched out.

DETAILED DESCRIPTION OF THE EMBODIMENT

Figure 1:
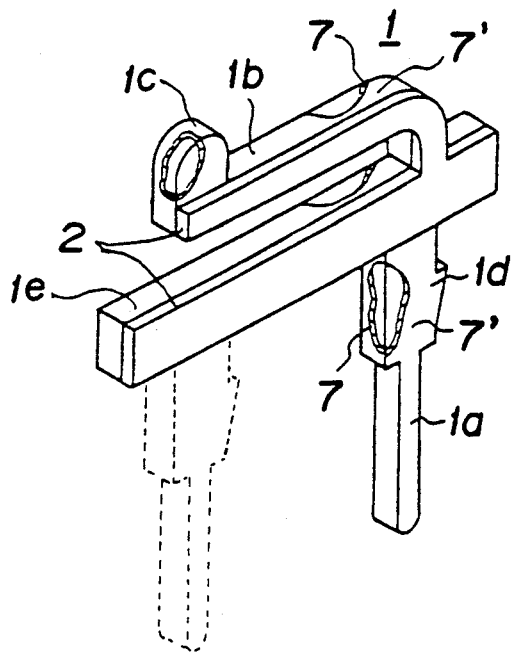
FIG. 1 is a perspective view, partly cut-away, of a contact according to one embodiment of the present invention.

The embodiment of the present invention will now be described with reference to FIGS. 1 through 7.

Numeral 1 denotes a contact on which an external terminal of an electric part such as an IC, etc., is to be placed for contact. The contact 1 has a terminal portion 1a extending downward at one end thereof and a spring portion 1b at the other end. The spring portion 1b, as shown in the Figures, is bent into a horizontal U-shape to increase the elasticity in the vertical direction, and a contacting portion 1c is formed at the free end of the spring portion 1b. An upper element of the horizontal U-shaped portion, serves as the spring portion 1b, while a lower element thereof serves as a supporting portion 1e.

Figure 5:
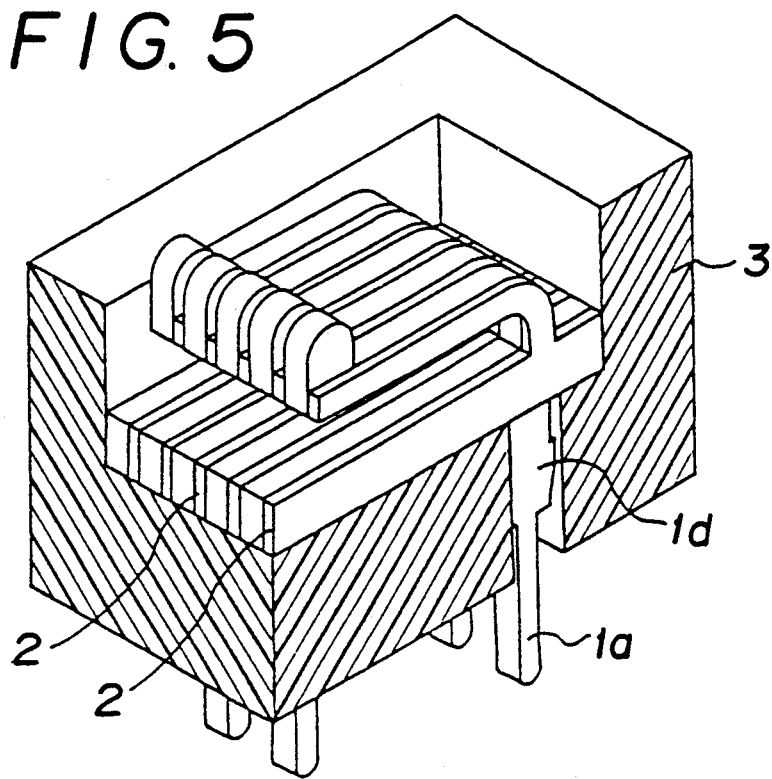
FIG. 5 is a sectional view of a socket board for implanting a contact therein.
Figure 6:
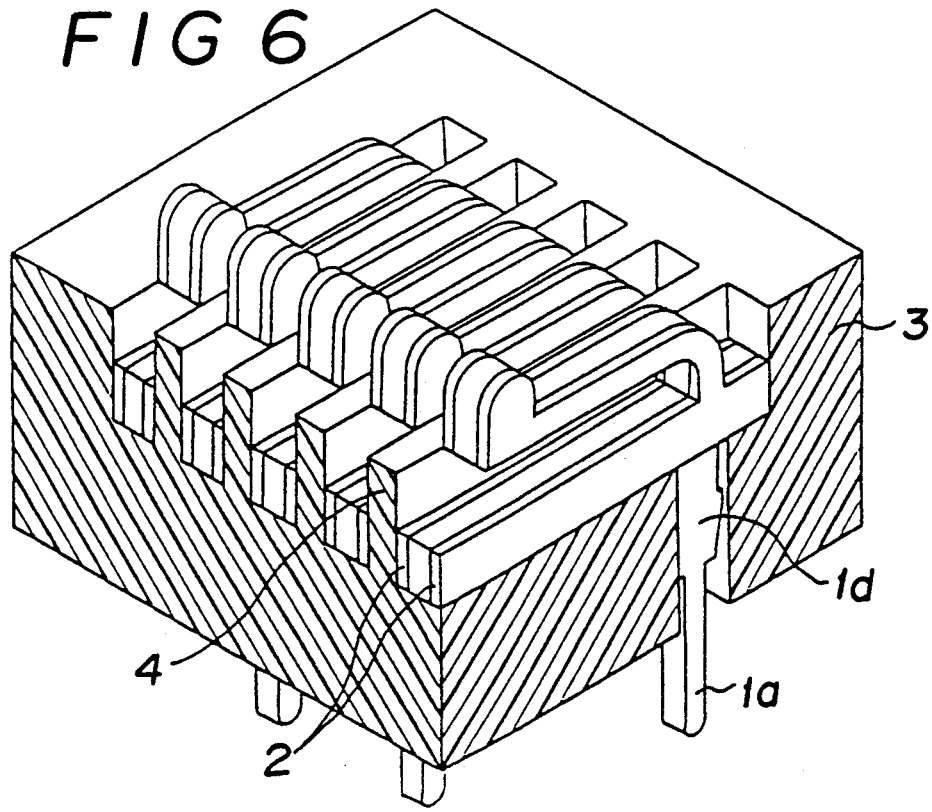
FIG. 6 is a sectional view of a socket board in which another implanting example is shown.

A press-fit claw is formed at a connecting portion between the terminal portion 1a and the spring portion 1b in such a manner as to project to form a planting portion 1d. By implanting the planting portion 1d into a socket board 3 as shown in FIGS. 5 and 6, the terminal portion 1a is permitted to project beneath the socket board 3 in order to facilitate an easy contact with a circuit board. Further, the contacts 1 are arranged in parallel relation at equal pitches in order to facilitate the external terminals 8 of an electric part to be smoothly placed on the contacting portions 1c for contact.

Figure 2:
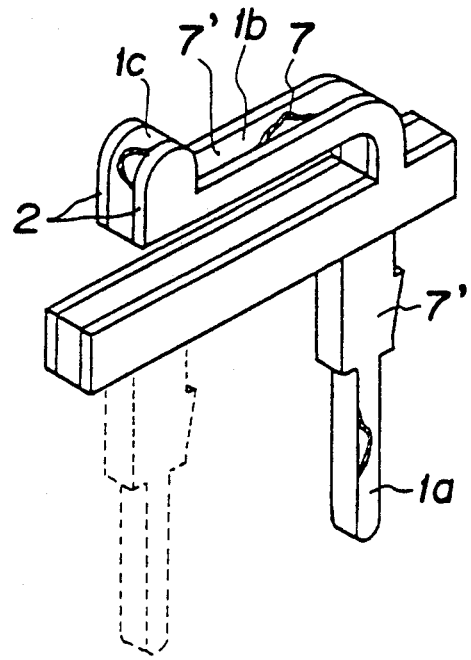
FIG. 2 is a perspective view, partly cut-away, of a contact according to another embodiment of the invention.

As is shown in FIG. 1, a film-like insulating material 2 is applied to one surface of the portion between the terminal portion 1a and the contacting portion 1c of the contact 1 as mentioned above, i.e., one surface of the spring portion 1b. As another example, the insulating material 2 may be applied to both surfaces of the contact 1, as shown in FIG. 2.

Preferably, the arrangement is such that the surface or surfaces to which the insulating material 2 is applied serve as boundary surfaces between adjacent contacts 1 when the contacts are arranged in parallel relation.

In the example of FIG. 5, the contacts 1 are each provided with the insulating material 2 applied to one surface (or both surfaces) thereof and arranged in contacting states or proximal states without providing a partition wall between the adjacent contacts 1. The insulating material 2 can thus serve as an electrical isolator disposed at the boundary surface of every adjacent contact 1. FIG. 6 shows an example in which the insulating material 2 is disposed at the boundary surface between every adjacent contact 1, and an insulating partition wall 4 is also disposed between every adjacent contact 1.

The insulating material 2 may be attached to the contact 1 after the configuration of the contact 1 is formed from a base material by pressing. Otherwise the material 2 may be attached to the base material (strip material) first and then the base material with the insulating material 2 attached thereto is pressed into the configurations of the individual contacts 1.

Figure 3:
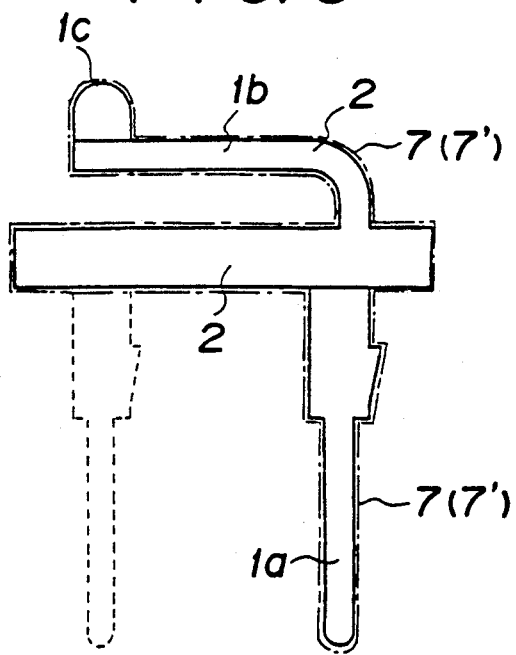
FIG. 3 is a side view of a contact.
Figure 4:
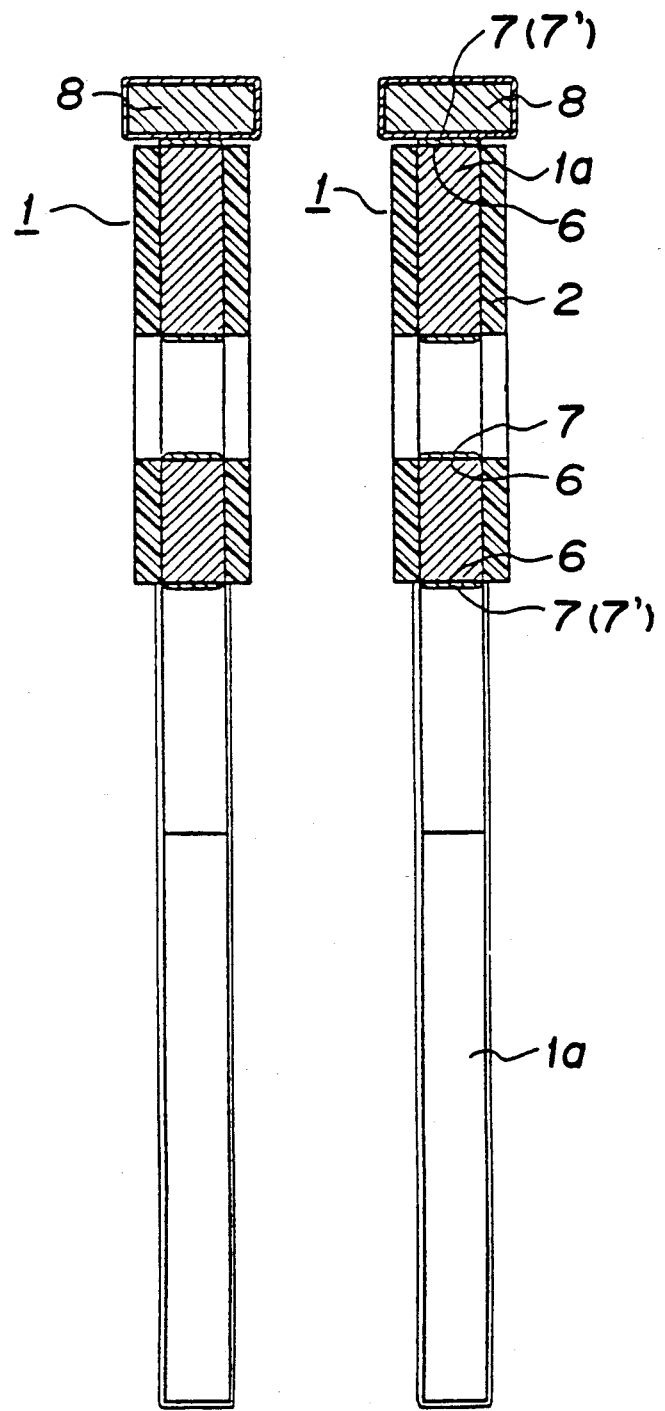
FIG. 4 is a sectional view of a contact which is in contact with an external terminal.
Figure 7A:
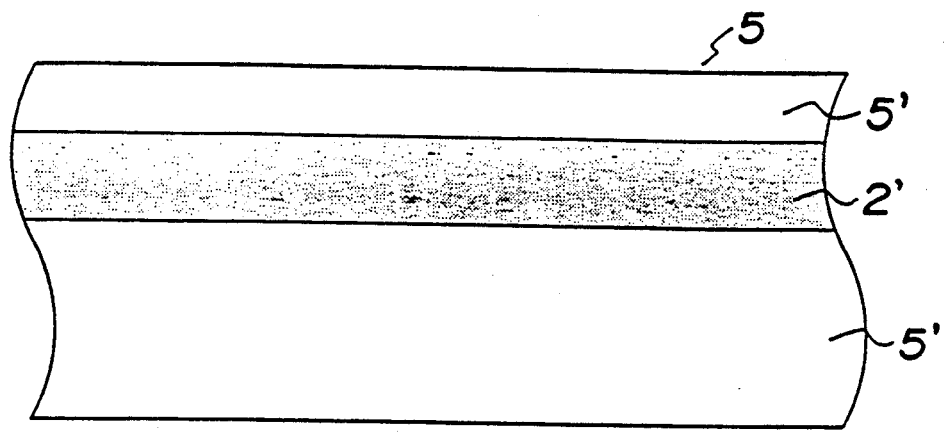
FIGS. 7A, 7B and 7C, respectively, show an example of punching-out processes.
Figure 7B:
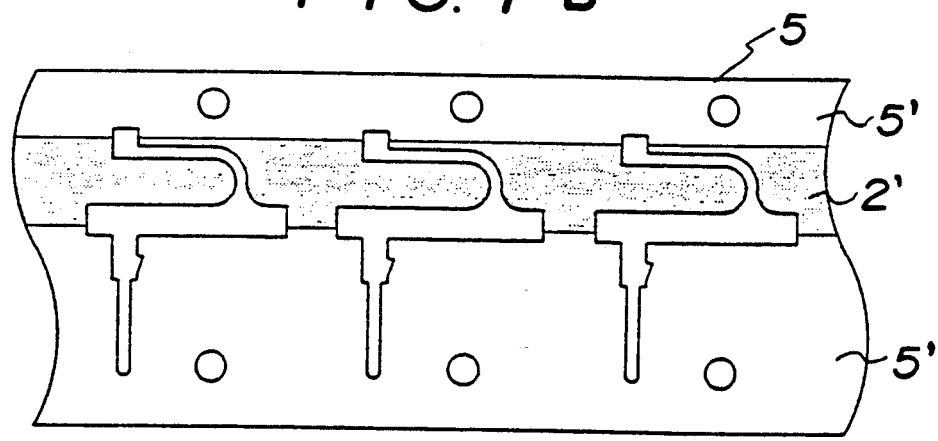
Figure 7C:
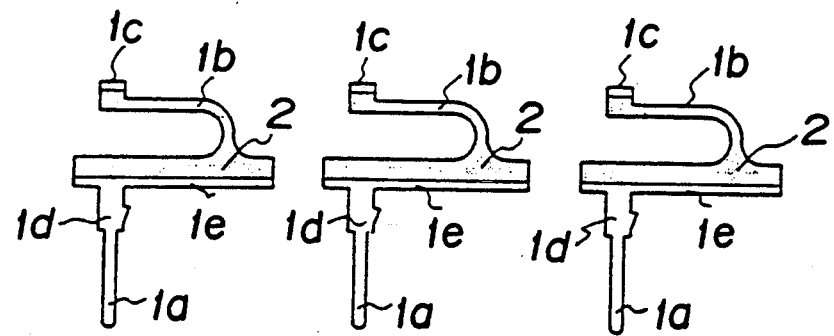

That is, as is shown in FIG. 7(A), an insulating film 2' of a narrow width is attached to one surface or both surfaces of a strip material 5, which is formed from contact material, over the entire length of the strip material 5 in such a manner as to form a strip shape thereon in the elongated direction of the strip material 5. A composite strip material is thereby prepared as a punching material, having base material exposing areas 5' at its upper and lower sides. The composite strip material 5 is then subjected to a punching process to punch out contacts 1 therefrom as shown in FIG. 7(B). At that time, both the terminal portion 1d and the contacting portion 1c of each contact 1 are punched out from the base material exposing areas 5' which are adjacent, upwardly and downwardly, to the insulating film 2', the insulating film 2' not being attached to th areas 5'. Both the spring portion 1b and the supporting portion 1e are punched out from the area where the insulating film 2' is attached to. Each of the obtained punched-out contacts 1 has the insulating material 2 either on one side or both sides thereof between the contacting portion 1c and the terminal portion 1a, and also has a punched-out sheared surface 6 continuously formed over the entire length between the contacting portion 1c and the terminal portion 1a as shown in FIGS. 3 and 4.

The above-mentioned punched-out contact 1' is subjected to plating with a favorable conductive material such as Au. By this plating, the contact 1' are caused to have a plated-layer 7 of Au on the areas other than the areas where the insulating material 2 is applied, and particularly on the punched-out sheared surface 6. By this continuous plated layer 7, a favorable conductive path 7' is formed along the area starting at the contacting portion 1c and ending at the terminal portion 1a. Prior to the Au plating, an Ni bed-plating may, of course, be effected.

The contact 1 with the insulating material 2 attached thereto is applied, on its entire surface, with an Ni bed-plating and an Au plating by electric plating according to a very popular plating method called "barrel plating". However, since the plating is effected according to an electric plating method, the plating is not effected on the insulating material 2, and the Au plating on the bed of Ni plating is effected only on the remaining area.

As a result, as is shown in FIG. 1, the Au plating on the bed of Ni plating is effected on both the terminal portion 1a and the contacting portion 1c, and the electric conductive path 7' is formed between the terminal portion 1a and the contacting portion 1c by the Au plating on the bed of Ni plating.

According to the present invention, the Au plating on the bed of Ni plating can be surely effected on both the contacting portion and the terminal portion of the contact. Moreover, a favorable electric conductive path can be formed between the contacting portion and the terminal portion by the Au plating on the bed of Ni plating. Furthermore, there can be produced contacts which satisfy proper requirements while attempting to save the consumption of gold by means of the application of a very popular plating method. Therefore, contacts of high reliability can be provided at low cost. In addition, the insulating material can be used as a means for electrically isolating every adjacent contact.

Having thus described the preferred embodiments of the invention, it should be understood that numerous structural changes and modifications may be resorted to without departing from the spirit and scope of the invention.

What is claimed is:

1. A contact, comprising:
   a terminal portion adapted to be attached to a circuit board for providing an electrical connection;
   a contact portion for contacting an electric part;
   a spring portion connected with said terminal portion and said contact portion having a side surface and elasticity for exerting a contact force on said contacting portion;
   an electrically insulating material on said side surface between said terminal portion and said contact portion for insulating said contact from other contacts; and
   an electrodeposit having favorable electrical conduction characteristics provided on said terminal portion, said spring portion and said contact portion only on the surfaces thereon not having said insulating material thereon, wherein an electrically conductive path is defined from said contact portion to said terminal portion by said electrodeposit.

2. The contact of claim 1, wherein said terminal portion, said contact portion and said spring portion are a punched-out unitary member having shear surfaces thereon, said shear surfaces having said electrodeposit thereon.

3. The contact of claim 1, wherein said electrodeposit is gold.

4. The contact of claim 1, wherein said spring portion has opposite side surfaces and a shear surface therebetween, said insulating material being applied to both said side surfaces and said electrodeposit being provided on said shear surface.

* * * * *